United States Patent
Carson et al.

(10) Patent No.: US 8,357,556 B2
(45) Date of Patent: *Jan. 22, 2013

(54) METHOD OF PROTECTING SEMICONDUCTOR CHIPS FROM MECHANICAL AND ESD DAMAGE DURING HANDLING

(75) Inventors: Richard Carson, Albuquerque, NM (US); Elaine Taylor, Albuquerque, NM (US); Douglas Collins, Albuquerque, NM (US)

(73) Assignee: Emcore Corporation, Albuquerque, NM (US)

( * ) Notice: Subject to any disclaimer, the term of this patent is extended or adjusted under 35 U.S.C. 154(b) by 84 days.

This patent is subject to a terminal disclaimer.

(21) Appl. No.: 12/476,895

(22) Filed: Jun. 2, 2009

(65) Prior Publication Data

US 2009/0238232 A1  Sep. 24, 2009

Related U.S. Application Data

(63) Continuation of application No. 11/280,378, filed on Nov. 16, 2005, now Pat. No. 7,547,572.

(51) Int. Cl.
*H01L 21/00* (2006.01)

(52) U.S. Cl. ..... 438/33; 438/63; 257/233; 257/E25.007; 257/E27.113; 313/5; 315/208

(58) Field of Classification Search .............. 438/26, 438/28, 33, 63, 68, 106, 113, 460, 461, 464, 438/667, 773, 776; 257/233, E25.007, E27.133; 313/3, 5, 523, 293–304, 208; 315/208, 339, 315/349, 523

See application file for complete search history.

(56) References Cited

U.S. PATENT DOCUMENTS

| | | | |
|---|---|---|---|
| 6,157,066 A * | 12/2000 | Kobayashi | 257/363 |
| 6,163,065 A * | 12/2000 | Seshan et al. | 257/620 |
| 6,233,267 B1 * | 5/2001 | Nurmikko et al. | 372/46.014 |
| 7,301,272 B2 | 11/2007 | Chu et al. | |
| 7,547,572 B2 * | 6/2009 | Carson et al. | 438/68 |
| 2002/0097059 A1 | 7/2002 | Tartagni et al. | |
| 2002/0195601 A1 | 12/2002 | Kwasnick et al. | |
| 2004/0150070 A1 * | 8/2004 | Okada et al. | 257/508 |
| 2005/0191845 A1 * | 9/2005 | Takada | 438/622 |
| 2005/0258901 A1 | 11/2005 | Khorramabadi | |
| 2005/0280007 A1 * | 12/2005 | Hsu et al. | 257/79 |
| 2006/0017372 A1 * | 1/2006 | Chu et al. | 313/498 |
| 2006/0175697 A1 | 8/2006 | Kurosawa et al. | |
| 2006/0274799 A1 | 12/2006 | Collins et al. | |

* cited by examiner

*Primary Examiner* — William D Coleman
*Assistant Examiner* — Su Kim

(57) ABSTRACT

A method and apparatus are provided for protecting a semiconductor device from damage. The method may include the steps of providing an active semiconductor device on a surface of a semiconductor substrate where the active device is surrounded by an inactive semiconductor area, and providing a soft metallic guard element in the inactive semiconductor area around at least a portion of the periphery of the active device wherein the metallic guard element is connected to ground potential and not to the active device.

14 Claims, 4 Drawing Sheets

METHOD OF PROTECTING SEMICONDUCTOR CHIPS FROM MECHANICAL AND ESD DAMAGE DURING HANDLING

RELATED APPLICATION

This application is a continuation of U.S. patent application Ser. No. 11/280,378 filed Nov. 16, 2005, and herein incorporated by reference in its entirety.

FIELD OF THE INVENTION

The field of the invention relates to semiconductors and more particularly to methods of semiconductor design and processing.

BACKGROUND OF THE INVENTION

Methods of manufacturing vertical cavity surface emitting laser (VCSEL) chips are generally known. However, one of the impediments to the successful manufacturing of such devices is the susceptibility of such devices to damage. In addition to physical damage, VCSELs and photodiodes may be subject to electrostat discharge (ESD) or electrical overstress (EOD) damage.

Two market trends are driving VCSEL and photodiode chip design towards a regime where die damage during handling is more and more likely. The first trend has to do with smaller active regions. Smaller active regions (volumes) are needed for higher speeds (e.g., 4 Gb/s, 10 Gb/s applications), modal control (e.g., sensing applications, optical mice, etc.) or both. ESD/EOS damage thresholds fall as one over the square of the optical aperture size of such devices.

In addition to smaller active regions, a second trend has to do with a smaller overall die (chip) size. Smaller chips are needed to reduce die manufacturing costs to meet market demanded prices.

To assemble separated die into packages, the die must be picked off of the wafer then placed into the final package. As chip size shrink, less chip area is allowed for the pickup tool. This means that die are being touched closer to their active regions where mechanical damage or ESD strikes are more likely to compromise chip reliability. The rate at which die fail early due to manufacturing damage is typically referred to as the infant mortality rate.

Statistics have shown that once installed, the average expected lifetime of conventional VCSELs are significantly longer than the devices in which the VCSELs are to be used. However, during manufacturing and before installation, VCSELs and photodiodes suffer a relatively high infant mortality rate due to handling practices. Mechanical damage and ESD strikes during chip handling, in fact, have been demonstrated to be the leading cause of infant mortality.

In addition to the direct loss due to infant mortality, additional efforts must be expended to identify damaged devices. For example, visual inspections are often performed to screen out die with mechanical damage.

However, visual inspection is imprecise, expensive and time consuming. Typically, the visual defects that must be screened out are either very small or very subtle.

Various electrical tests may be performed to identify die that have suffered ESD/EOS damage. In some cases, packaged die may be burned-in at currents and ambient temperatures above what would be expected during use in an attempt to identify damaged die.

Electrical tests for ESD damage are effective if properly performed and interpreted. However, they are also time consuming and expensive.

In addition, visual and/or electrical testing may not always be practical. For example, future applications, such as optical computer mice, are expected to be extremely price sensitive. Burn-in of all or some portion of packaged parts may not be economically feasible. Accordingly, a need exists for methods of reducing the root causes for infant mortality due to ESD and or reducing the need for visual inspections.

SUMMARY

A method and apparatus are provided for protecting a semiconductor device from damage. The method may include the steps of providing an active semiconductor device on a surface of a semiconductor substrate where the active device is surrounded by an inactive semiconductor area and providing a soft metallic guard element in the inactive semiconductor area around at least a portion of the periphery of the active device wherein the metallic guard element is connected to ground potential and not to the active device.

DETAILED DESCRIPTION OF AN ILLUSTRATED EMBODIMENT

Figure 1:
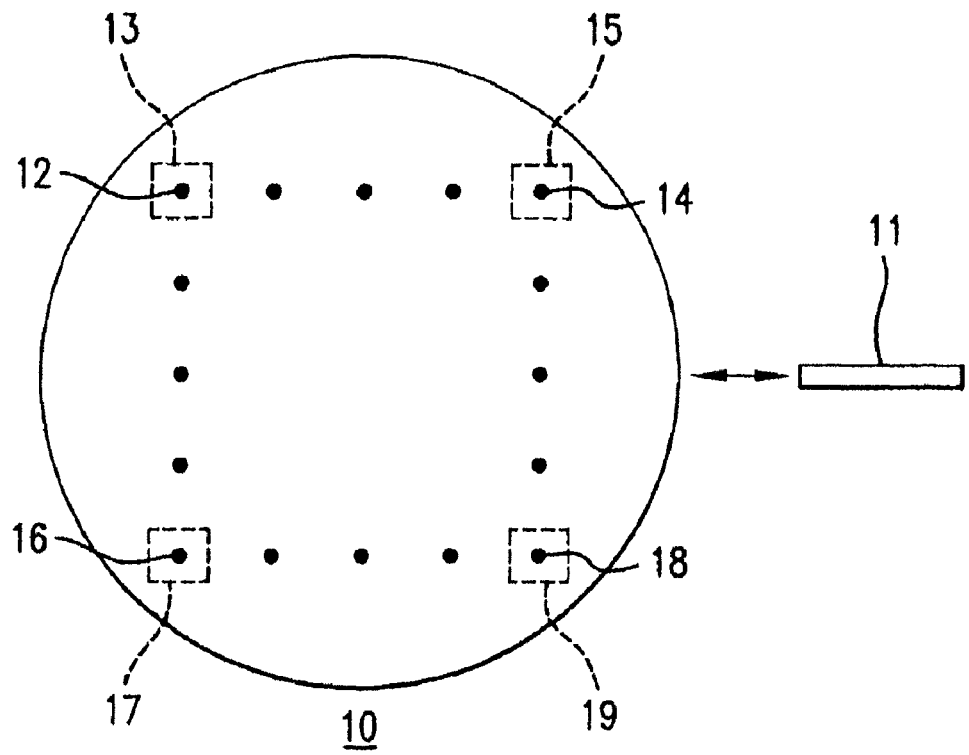
FIG. 1 is a top plan view of a wafer under an illustrated embodiment of the invention.
Figure 3:
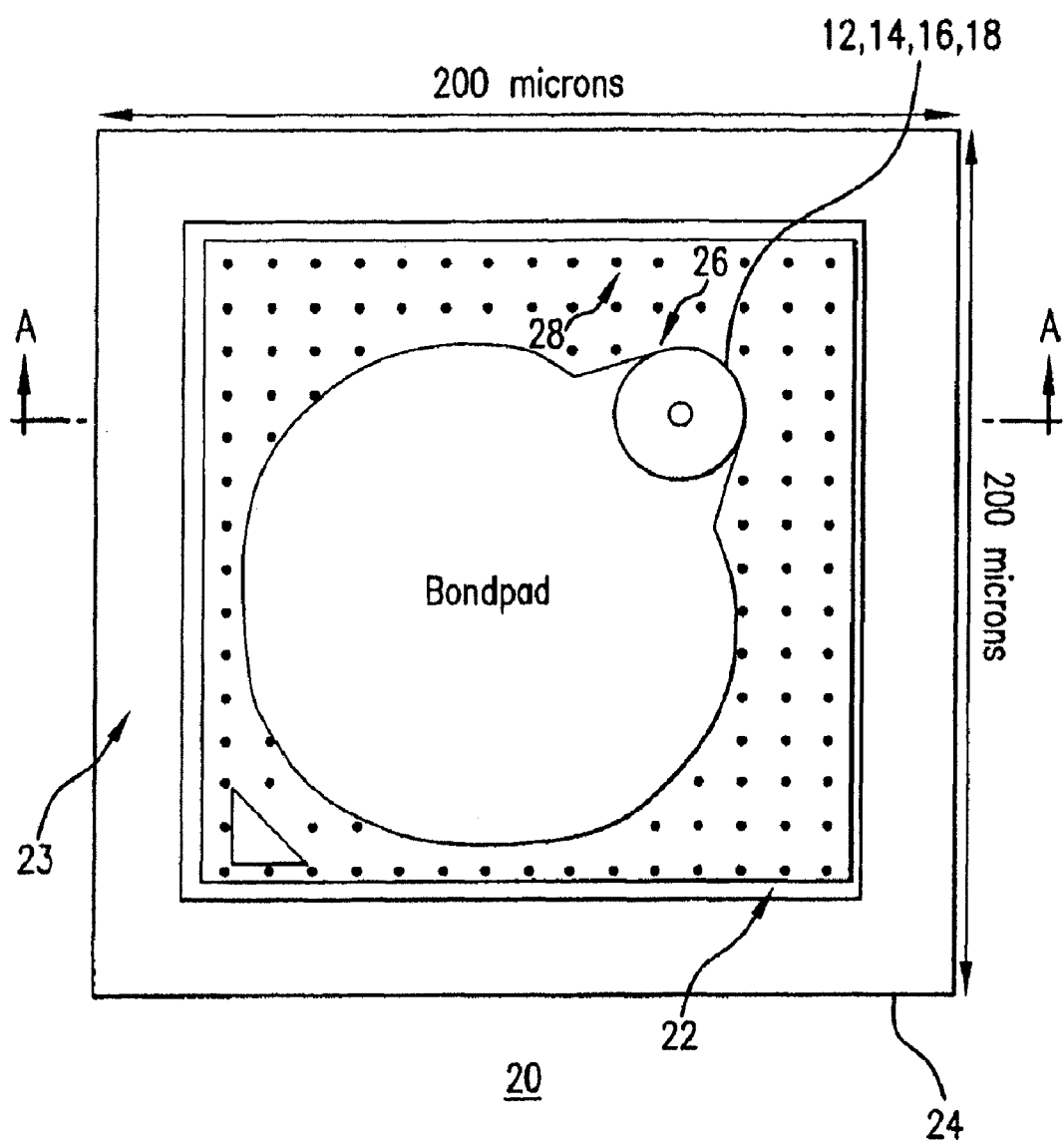
FIG. 3 is a top view of a chip of the wafer of FIG. 1.
Figure 4:
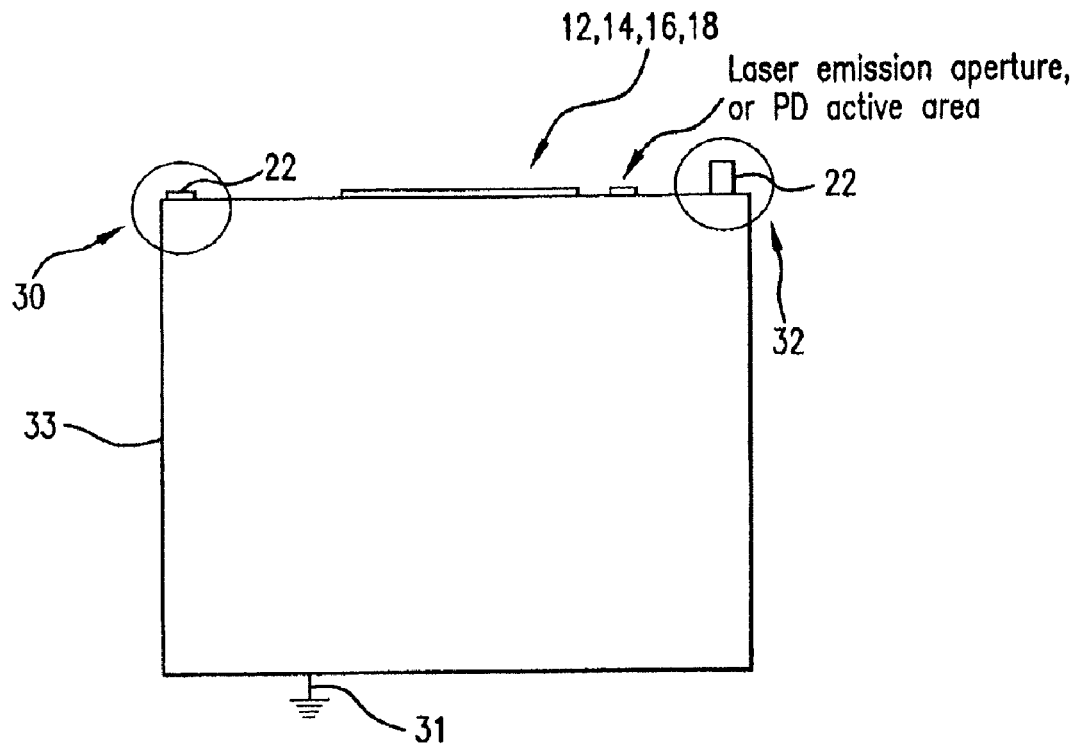
FIG. 4 is a side cut-away view of the chip of FIG. 3 under one embodiment of the invention.
Figure 5:
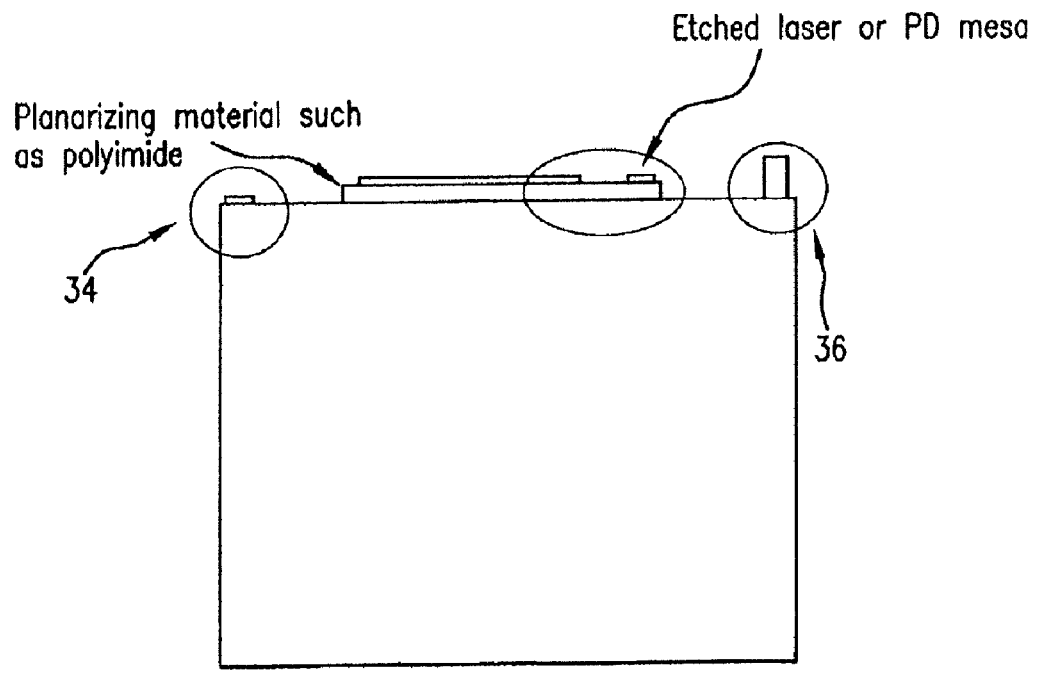
FIG. 5 is a side cut-away view of the chip of FIG. 3 under another embodiment of the invention.
Figure 6:
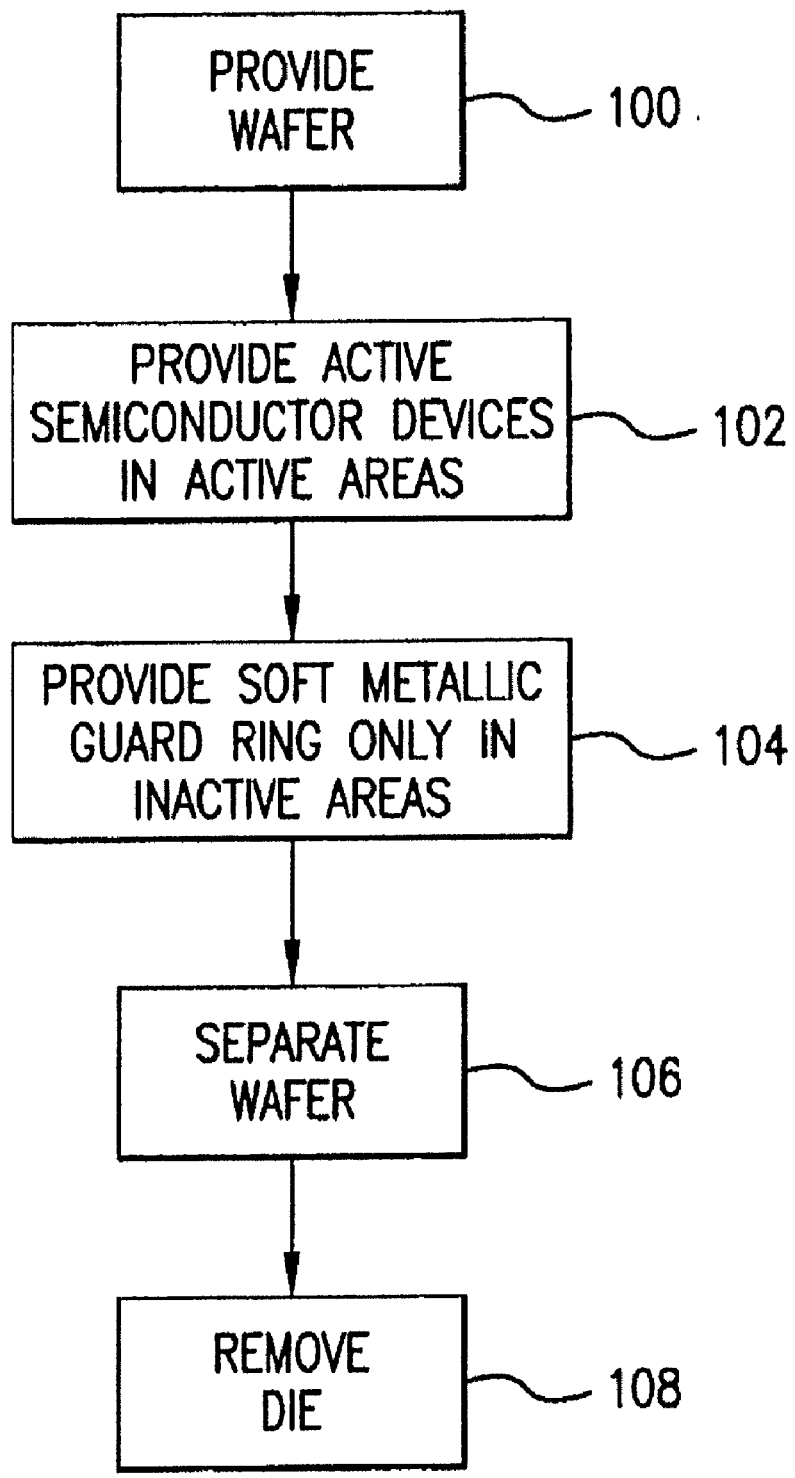
FIG. 6 is a flow chart of process steps that may be used to fabricate the wafer of FIG. 1.

FIG. 1 depicts a wafer 10 of semiconductor devices 12, 14, 16, 18 fabricated in accordance with an illustrated embodiment of the invention. FIG. 3 is an exemplary semiconductor chip 20 formed by separating the wafer 10 and where each chip 20 contains one of the semiconductor devices 12, 14, 16, 18. FIGS. 4 and 5 show alternative cut-away side views of the chip 20. The semiconductor devices 12, 14, 16, 18 may be VCSEL lasers or photodiodes and may be either arrays or single devices.

In addition to the semiconductor device 12, 14, 16, 18, each chip 20 is provided with a guard ring 22 (FIG. 3) for mechanically protecting the optical aperture of the semiconductor device 12, 14, 16, 18 from mechanical damage as well as to provide a harmless discharge path for any charge that may build up on pickup tools. If severe mechanical damage does occur, the guard ring is designed to provide a clear visual indicator of damage thereby increasing the likelihood that the chip 20 will be discarded before being used.

Turning now to the drawings, the wafer 10 may be divided into a grid of chip areas 13, 15, 17, 19 (where each chip area may be as depicted as shown in FIG. 3). The active areas 26 of the wafer 10 are separated from other active areas 26 (and surrounded) by inactive areas 28 (where the inactive areas 28 do not include any other active devices).

The chips 20 may be formed by providing 100 an appropriate wafer 10 and fabricating 102 the semiconductor devices 12, 14, 16, 18 in a conventional manner within the active areas 26. The guard rings 22 may be fabricated 104 within the chip areas 13, 15, 17, 19, but only within the inactive areas 28. The guard rings 22 may be created during fabrication of the semiconductor devices 12, 14, 16, 18 or as separate process steps.

FIG. 4 depicts a cross-section of the chip 20 along section lines A-A that shows a planar structure (i.e., an implanted VCSEL laser or photodiode). Under a first option (reference 30 in FIG. 4), the entire guard ring 22 may be formed by an evaporated metal process while also forming the interconnect and p-ohmic metal layers of the active device 12, 14, 16, 18. Under the first option, the guard ring is at least the same height as the tallest structure on the semiconductor device 12, 14, 16, 18 of the chip 20. Tallest, in this case, means the furthest distance measured away from the wafer surface. As shown in FIG. 4, the guard ring 22 forms a connection with a ground potential 31 through the substrate 33.

Under a second option (reference 32 of FIG. 4), an additional step may be added to the fabrication process flow to build up additional metal on the guard ring 22. In this case, the guard ring 22 may be defined using a photolithographic mask and metal may be plated onto the defined area. In this case, the guard ring 22 is significantly higher (taller) than any structure of the active device 12, 14, 16, 18.

FIG. 5 depicts a cross-section of the chip 20 along section lines A-A for a mesa structure (i.e., an oxide VCSEL laser or etched photodiode). Under a third option (reference 34 in FIG. 5), the entire guard ring 22 may be formed by an evaporated metal process while also forming the interconnect metal layers. In this case, the top of the guard ring 22 is lower than the top of the active region, so it provides very little mechanical protection. However, it can still provide an ESD discharge path to ground potential 31.

Under a fourth option (reference 36 of FIG. 5), an additional step may be added to the fabrication process flow to build up additional metal on the guard ring 22. In this case, the guard ring 22 may be defined using a photolithographic mask and metal may be plated onto the defined area. In this case, the guard ring 22 is again higher (taller) than any structure of the active device 12, 14, 16, 18.

The guard ring 22 may be fabricated of any appropriate, relatively soft metal. In one embodiment, the relatively soft metal may be gold.

Figure 2:
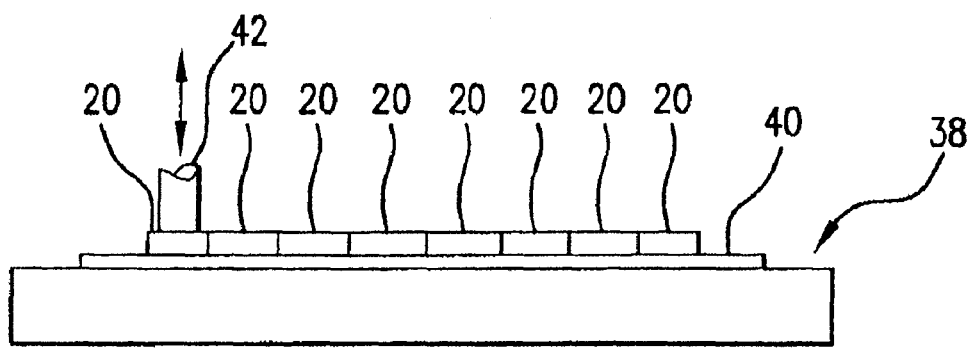
FIG. 2 is a side cut-away view of the wafer of FIG. 1.

Once fabricated, the wafer 10 may mounted to a saw frame 38 (FIG. 2) for separation 106. An adhesive layer 40 may be used to attach the wafer 10 to the dicing saw frame.

Once attached to the saw frame 38, the wafer 10 may be separated (while still attached to the saw frame 38) into the respective chips 20. Separation may be by dicing (using a dicing saw 11) or by cleaving.

Once separated, the chips 20 may be removed 108 from the saw frame 38 using a pick and place tool 42. Reference number 23 in FIG. 3 depicts an intended target area for the pick and place tool 42.

The use of the pick and place tool 42 (while necessary to remove the chips from the saw frame 38 can damage the chips 20 in any of a number of different ways. For example, static electricity may build up on the tool 42 and discharge through the device 12, 14, 16, 18. Alternatively, the tool 42 may strike the chip 20 at too high a rate of speed, thereby damaging the structure of the device 12, 14, 16, 18.

Under some illustrated embodiments of the invention (discussed above), the guard ring 22 on each chip 20 maybe the highest point on the die 20 so that if the surface of the die is struck during handling, the guard ring 20 would absorb the force protecting the active region of the laser or photodiode. Additionally, the ring 22 is fabricated from a soft metal, so that there would be a clear visual indication of mechanical damage. Additionally, the guard ring 22 is in electrical contact with a harmless ESD discharge path to ground potential so that any charge that builds up on the pickup tool would be safely bled conducted away from the chip 20 without damaging the active region of the chip 20.

A specific embodiment of novel apparatus for protecting semiconductor devices on a fabricated semiconductor wafer according to the present invention have been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention, any and all modifications, variations, or equivalents that fall within the true spirit and scope of the basic underlying principles disclosed and claimed herein.

What is claimed is:

1. A method of protecting a semiconductor device from damage comprising:

providing a semiconductor wafer;

providing a plurality of active semiconductor devices on the surface of the wafer wherein each active semiconductor device is separated from other active semiconductor devices by an inactive semiconductor area that does not include an active semiconductor device;

providing a metallic guard element around at least a portion of a periphery of each active semiconductor device in the inactive semiconductor area wherein each metallic guard element extends outward from the surface of the wafer a greater distance than the active semiconductor device to protect the active semiconductor device from mechanical damage caused by a pick and place tool and is connected to ground potential and not to the active semiconductor device, each metallic guard element being softer than the semiconductor wafer;

separating the wafer into a plurality of die wherein each die of the plurality of die contains one of the plurality of active semiconductor devices and the corresponding metallic guard element; and removing one of the plurality of dies from the wafer using a pick and place tool such that mechanical damage caused by the pick and place tool appears as a mark in one of the metallic guard elements and static electricity from the pick and place tool is dissipated to ground potential through one of the metallic guard elements.

2. The method of protecting the semiconductor device as in claim 1, wherein the active semiconductor device of the die being removed further comprises a VCSEL laser.

3. The method of protecting the semiconductor device as in claim 1, further comprising providing the metallic guard element around an entirety of the active semiconductor device.

4. A method of protecting a semiconductor device from damage comprising:

providing a semiconductor wafer with a plurality of active semiconductor devices;

wherein each active semiconductor device of the plurality of active semiconductor devices includes a single VCSEL or photodiode and is separated from the other of the plurality of active semiconductor devices by an inactive area and each active semiconductor device of the plurality of active semiconductor devices is surrounded at least in part by a metallic guard element that extends outward from a surface of the wafer a greater distance than the corresponding active semiconductor device to protect the active semiconductor device from mechanical damage caused by a pick and place tool, is softer than the semiconductor wafer and is connected to ground potential and not to the active device;

separating the wafer into a plurality of die wherein each die of the plurality of die includes one of the plurality of active semiconductor devices and the corresponding metallic guard element.

5. A semiconductor device comprising:

a semiconductor substrate having a surface including an active semiconductor device directly surrounded by an inactive semiconductor area, the active semiconductor device including an active semiconductor device selected from the group consisting of a laser and a photodiode;

a metallic grounding element disposed on the surface of said semiconductor substrate within the inactive semiconductor area surrounding the active semiconductor device, said metallic grounding element being in electrical contact with an electrostatic discharge path to ground potential through the semiconductor substrate while not being in electrical contact with the active semiconductor device via a metallic conductor.

6. The device as in claim 5, wherein the metallic grounding element comprises a continuous ring around the active semiconductor device.

7. The device as in claim 5, wherein the metallic grounding element further comprises gold.

8. The device as in claim 5, wherein the laser is a VCSEL.

9. The device as in claim 8, wherein the VCSEL has a laser emission aperture, and wherein the metallic grounding element extends outward from the substrate a greater amount than a top of the laser emission aperture of the active semiconductor device.

10. A semiconductor device comprising:

a semiconductor substrate having a surface including at least one active semiconductor device directly surrounded by an inactive semiconductor area;

a metallic guard element disposed on the surface of the semiconductor substrate and at least peripherally surrounding a portion of the at least one active semiconductor device, wherein the metallic guard element extends outward from the surface of the semiconductor substrate a distance greater than the at least one active semiconductor device to protect the at least one active semiconductor device from mechanical damage caused by a pick and place tool.

11. A semiconductor device comprising:

a semiconductor chip having a surface including at least one VCSEL surrounded by an inactive semiconductor area, the at least one VCSEL including a laser emission aperture;

a metallic guard element disposed on the surface of the semiconductor chip within the inactive semiconductor area, and at least peripherally surrounding a portion of the at least one active semiconductor device, wherein the metallic guard element extends outward from the surface of the semiconductor chip a distance greater than the laser emission aperture, thereby serving to protect the at least one VCSEL from mechanical damage.

12. A semiconductor device comprising:

a semiconductor chip having a surface including a VCSEL surrounded by an inactive semiconductor area, the VCSEL including a laser emission aperture;

a metallic grounding element disposed on the surface of said semiconductor chip within the inactive semiconductor area surrounding the active semiconductor device, said metallic grounding element being in electrical contact with an electrostatic discharge path to ground potential through the semiconductor chip while not being in electrical contact with the VCSEL via a metallic conductor, wherein the metallic guard element extends outward from the surface of the semiconductor chip a distance greater than the laser emission aperture.

13. A semiconductor device comprising:

a semiconductor chip having a surface including an active semiconductor device surrounded by an inactive semiconductor area, the active semiconductor device comprising an active semiconductor device selected from a group consisting of a laser having a laser emission aperture and a photodiode having an active area;

a metallic grounding element disposed on the surface of said semiconductor chip only within the inactive semiconductor area surrounding the active semiconductor device, said metallic grounding element being in electrical contact with an electrostatic discharge path to ground potential, the electrostatic discharge path including an electrical path through the semiconductor chip that does not include the active semiconductor device, wherein the metallic grounding element extends outward from the surface of the semiconductor chip a distance greater than the laser emission aperture or the active area of the photo diode.

14. A semiconductor device comprising:

a semiconductor chip having a surface including an active semiconductor device surrounded by an inactive semiconductor area, the active semiconductor device including a laser having a laser emission aperture;

a metallic grounding element disposed on the surface of said semiconductor chip within the inactive semiconductor area surrounding the active semiconductor device, said metallic grounding element being in electrical contact with an electrostatic discharge path to ground potential through the semiconductor chip while not being in electrical contact with the active semiconductor device via a metallic conductor, and wherein the metallic grounding element extends outward from the surface of the semiconductor chip a distance greater than the laser emission aperture.

* * * * *